(12) United States Patent
Chan et al.

(10) Patent No.: US 6,306,706 B1
(45) Date of Patent: Oct. 23, 2001

(54) METHOD AND SYSTEM FOR FABRICATING A FLASH MEMORY ARRAY

(75) Inventors: Maria C. Chan, San Jose; Hao Fang, Cupertino; Mark S. Chang, Los Altos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/538,922

(22) Filed: Mar. 30, 2000

(51) Int. Cl.$^7$ ................................................. H01L 21/8247
(52) U.S. Cl. ........................................... 438/258; 29/25.01
(58) Field of Search .................................. 438/257–267; 29/25.01

(56) References Cited

U.S. PATENT DOCUMENTS 5,538,912 * 7/1996 Kunori et al. .

* cited by examiner

*Primary Examiner*—Richard Booth
(74) *Attorney, Agent, or Firm*—Sawyer Law Group LLP

(57) ABSTRACT

A method and system for fabricating a flash memory array comprising a core area and a periphery area is disclosed. The method and system comprises depositing a layer of poly2 over the core area and the periphery area, selectively etching the core area, and selectively etching the poly2 only in the periphery area wherein the occurrence of stringers is reduced. Through the use of the preferred embodiment of the present invention, the core and periphery areas are etched separately after the deposition of the poly2, thereby reducing the occurrence of stringers at the core/periphery interface. Accordingly, the occurrence of unwanted electrical shorting paths between the adjacent transistors is substantially reduced.

8 Claims, 5 Drawing Sheets

001
METHOD AND SYSTEM FOR FABRICATING A FLASH MEMORY ARRAY

FIELD OF INVENTION

The present invention relates generally to flash memory arrays and more specifically to a method and system for fabricating a flash memory array.

BACKGROUND OF THE INVENTION

Semiconductor manufacturers have increasingly turned to high density flash memory arrays in their integrated circuit design schemes. The flash memory array includes columns of active regions that are separated by columns of insulating field oxide regions. The transistors are spaced apart in the active regions and each a row of transistors are bits in a memory word. The transistors are formed with various materials including a type-1 layer of polysilicon, and transistors forming a row in the array are connected by a word-line comprising a type-2 layer of polysilicon.

To achieve a high density integrated circuit, the transistors must be as small as possible. Typically, these high density flash memory integrated circuits utilize NAND-type gates as opposed to NOR-type gates since NAND gates have a considerably higher density than NOR gates. Smaller transistors allow more transistors to be placed on a single substrate, thereby allowing relatively large circuit systems to be incorporated on a single, relatively small die area.

FIG. 1 is a top view of a portion of a NAND flash memory array 10. The flash memory array 10 includes a core area 12 and a periphery area 14. The core area 12 includes an array of memory transistors 16 and two select gate regions that include a row of select transistors connected by a select word-line 28. One select gate region is referred to as a select drain gate region 18 and the other select gate region is referred to as a select source gate region 20. Although not shown, the periphery area 14 contains low-voltage transistors for handling logic and switching circuitry, and high-voltage transistors for handling high-voltages encountered during flash memory programming and erase operations.

FIG. 2 is a flow chart illustrating the conventional process steps required to fabricate a flash memory. Also shown is a series of cross sectional views (FIGS. 2(a–f)) of a substrate showing the resulting structure.

The process begins by depositing a layer of tunnel oxide of varying thickness over a substrate in both the core area and periphery areas, via step 30. Next, a layer of type-1 polysilicon (poly1) is deposited in both the core area and periphery area, via step 32. Next, the periphery area is covered and the poly1 is etched from the core area, via step 34. After the poly1 is etched from the core area, a layer of oxide nitride (ONO) is deposited over both the core area and periphery area, via step 36.

After the layer of ONO is deposited, the core area is covered by photo resist and the ONO and poly1 layers are removed in the periphery area, via step 38. Next, a type-2 layer of polysilicon (poly2) is deposited over both the core area and the periphery area, via step 40. Both the core and periphery areas are then etched, via step 42.

The etching process in step 42 is anisotropic, meaning that it removes material directionally to a predetermined depth. But due to the stack height difference between the core area and the periphery area, as illustrated in FIG. 3, the etching process sometimes fails to remove all of the poly1 around the ONO fence area especially at the core/periphery interface and the ONO fence area in the core area, leaving a residue material which is called a stringer. FIG. 4 shows exploded views of FIGS. 2(f) and 2(g) to illustrate the formation of a stringer at the core/periphery interface after the poly2 etch. The presence of a stringer can provide a contact between the two adjacent transistors and failure to remove this material can lead to unwanted electrical shorting paths between the adjacent transistors.

Utilizing the NOR technology, the stringers are not a problem because steps that are implemented later in the NOR process (i.e. dipping steps, oxidation steps), effectively eliminate the stringers. However, as previously mentioned, the NAND process is utilized for high density flash memory integrated circuits since NAND gates have a considerably higher density than NOR gates. Consequently, the NAND process does not incorporate later steps to effectively eliminate the stringers.

Accordingly, what is needed is a method for reducing the occurrence of stringers in the fabrication of flash memory arrays. The present invention addresses such a need.

SUMMARY OF THE INVENTION

A method and system for fabricating a flash memory array comprising a core area and a periphery area is disclosed. The method and system comprises depositing a layer of poly2 over the core area and the periphery area, selectively etching the core area, and selectively etching the poly2 only in the periphery area wherein the occurrence of stringers is reduced.

Through the use of the preferred embodiment of the present invention, the core and periphery areas are etched separately after the deposition of the poly2, thereby reducing the occurrence of stringers at the core/periphery interface. Accordingly, the occurrence of unwanted electrical shorting paths between the adjacent transistors is substantially reduced.

DETAILED DESCRIPTION OF THE INVENTION

The present invention provides a method and system for fabricating a flash memory array. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The method and system in accordance with the present invention is described in the context of a preferred embodiment. The preferred embodiment provides that the core and periphery regions of a flash memory are etched separately after the deposition of poly2 layer, thereby reducing the occurrence of stringers at the core/periphery interface.

Figure 1:
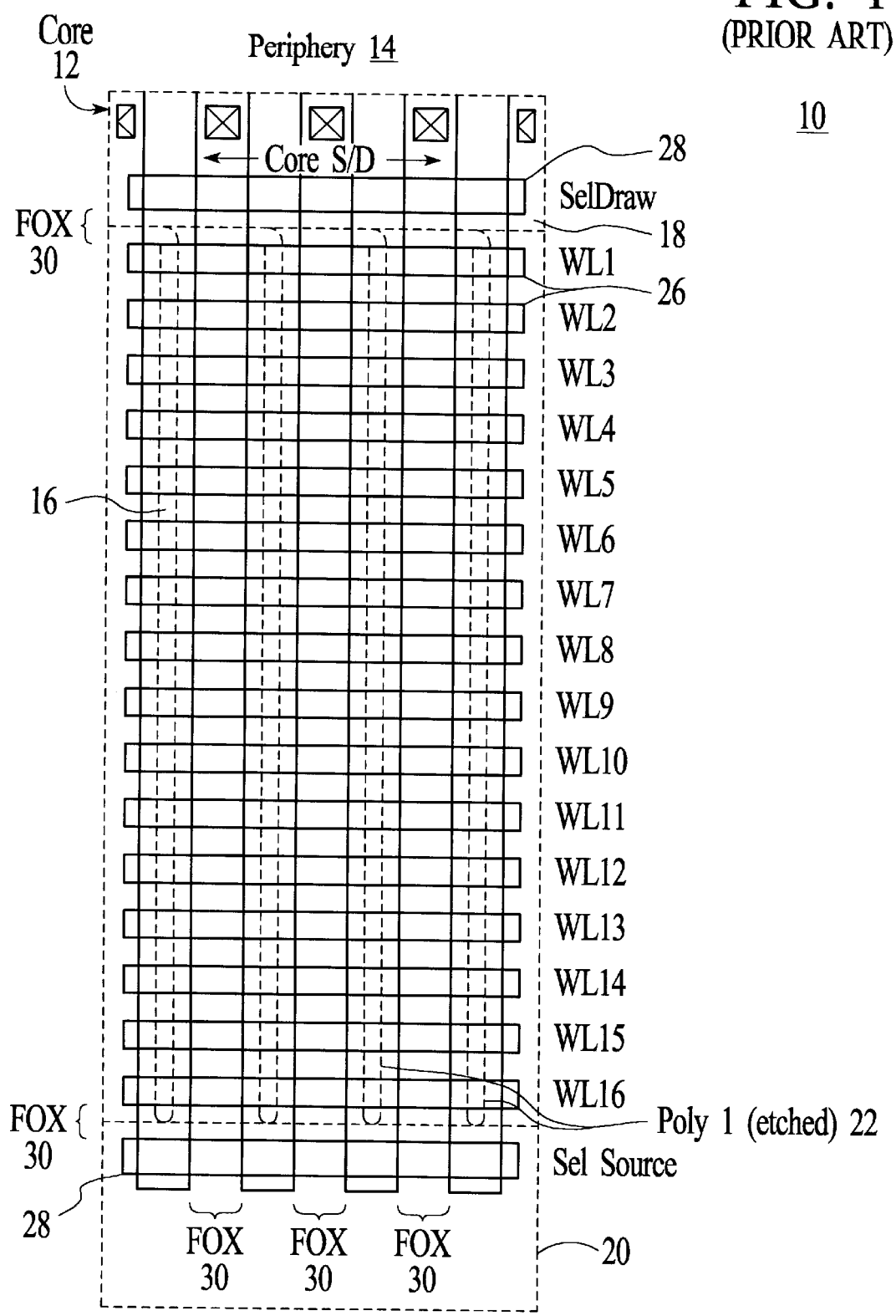
FIG. 1 is a top view of a portion of a NAND flash memory array.
Figure 2:
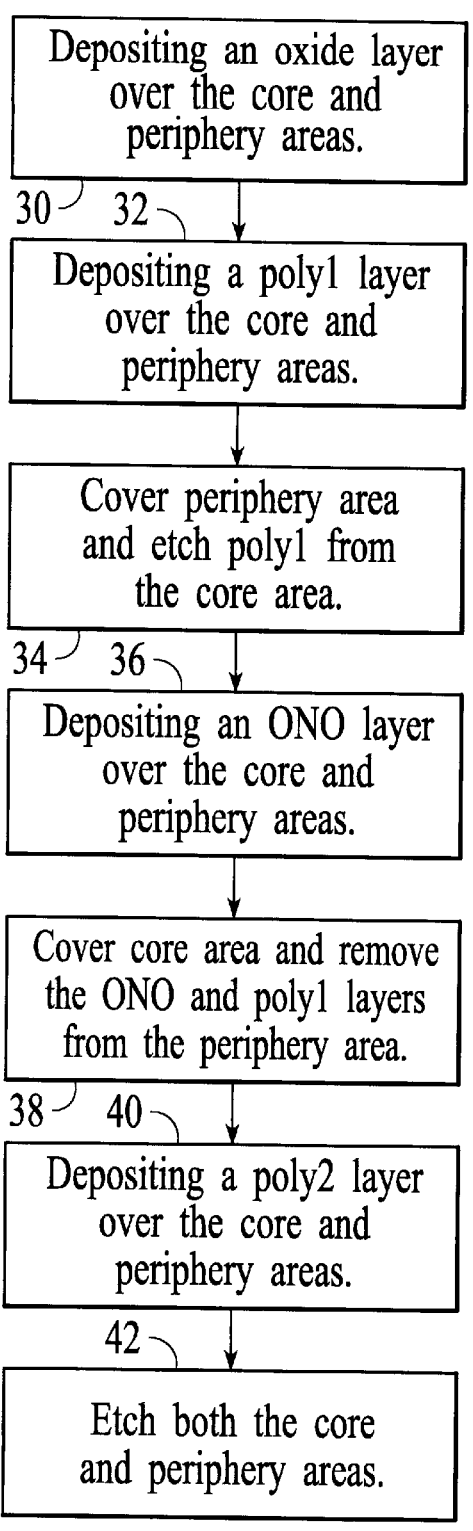
FIGS. 2(A)–2(G) are a flow chart illustrating the conventional process steps required to fabricate a flash memory as well as a series of cross sectional views of a substrate showing the resulting structure.
Figure 2:
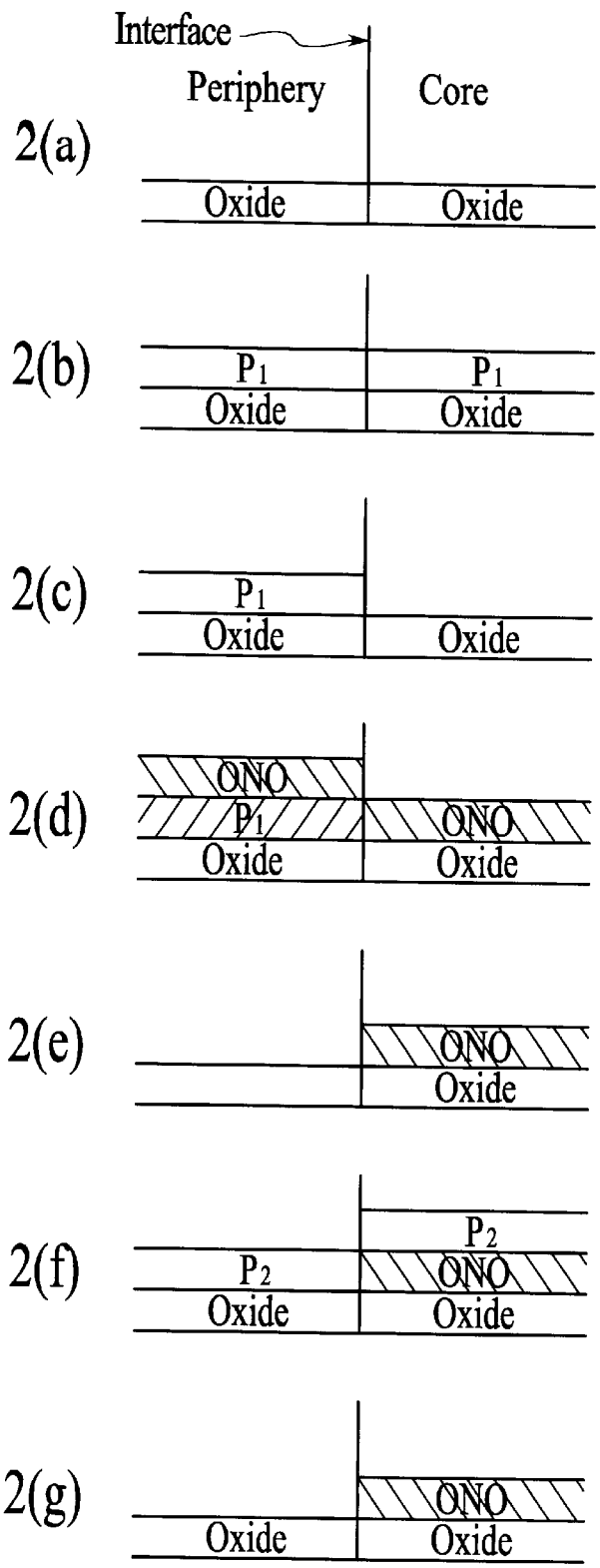
Figure 3:
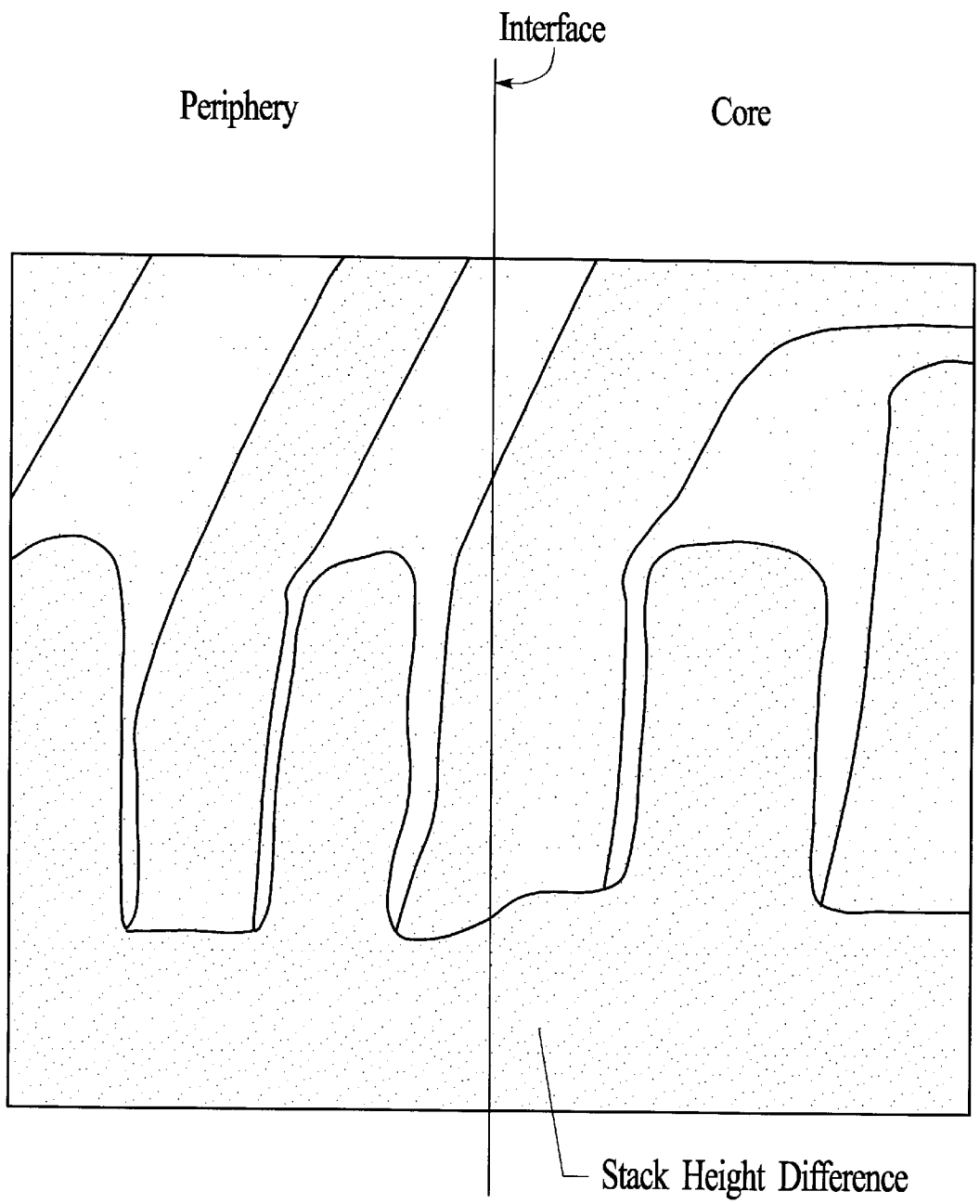
FIG. 3 shows the stack height difference in the core and periphery areas of a conventional flash memory array.
Figure 4:
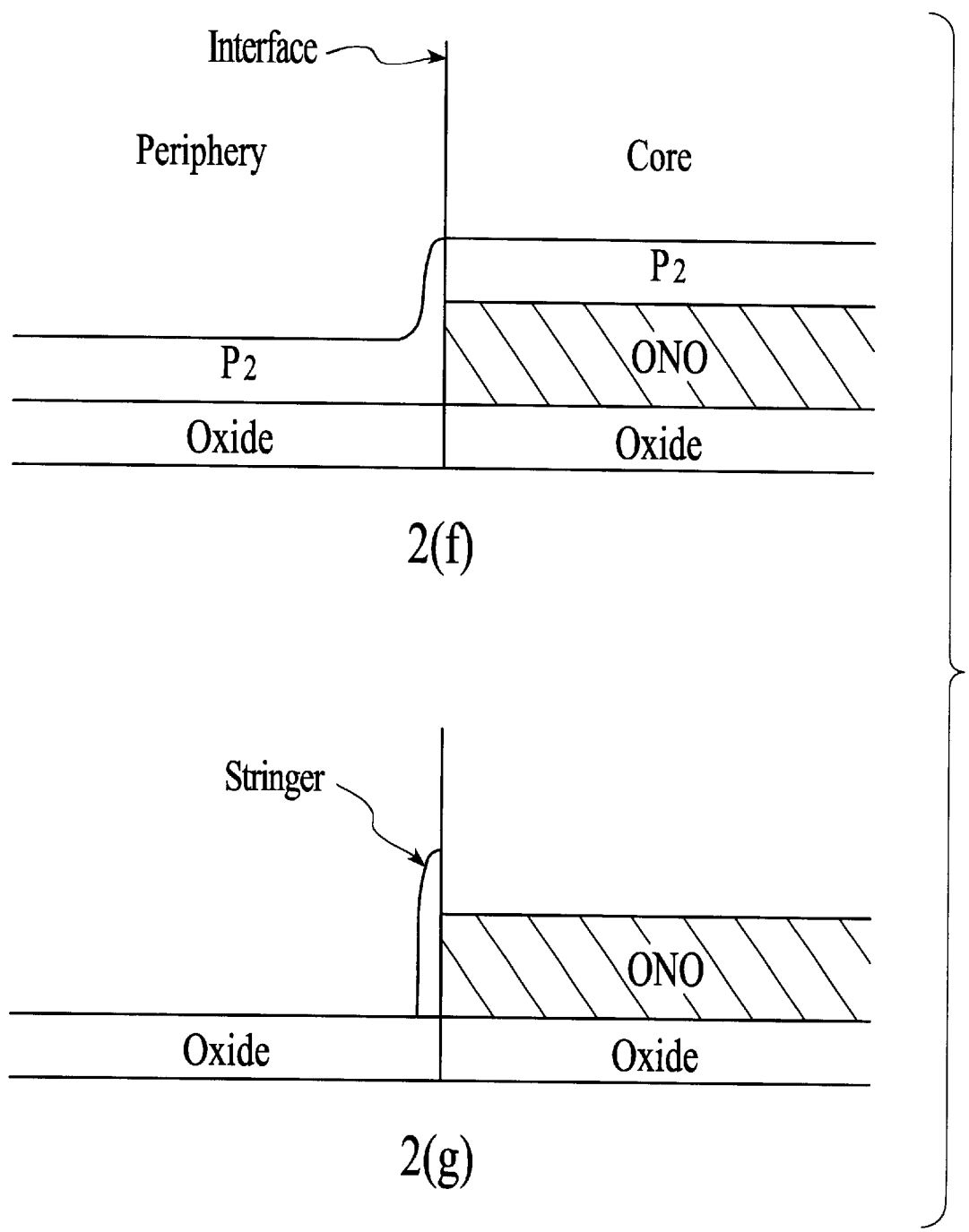
FIG. 4 shows exploded views of cross sectional views 2(f) and 2(g).
Figure 5:
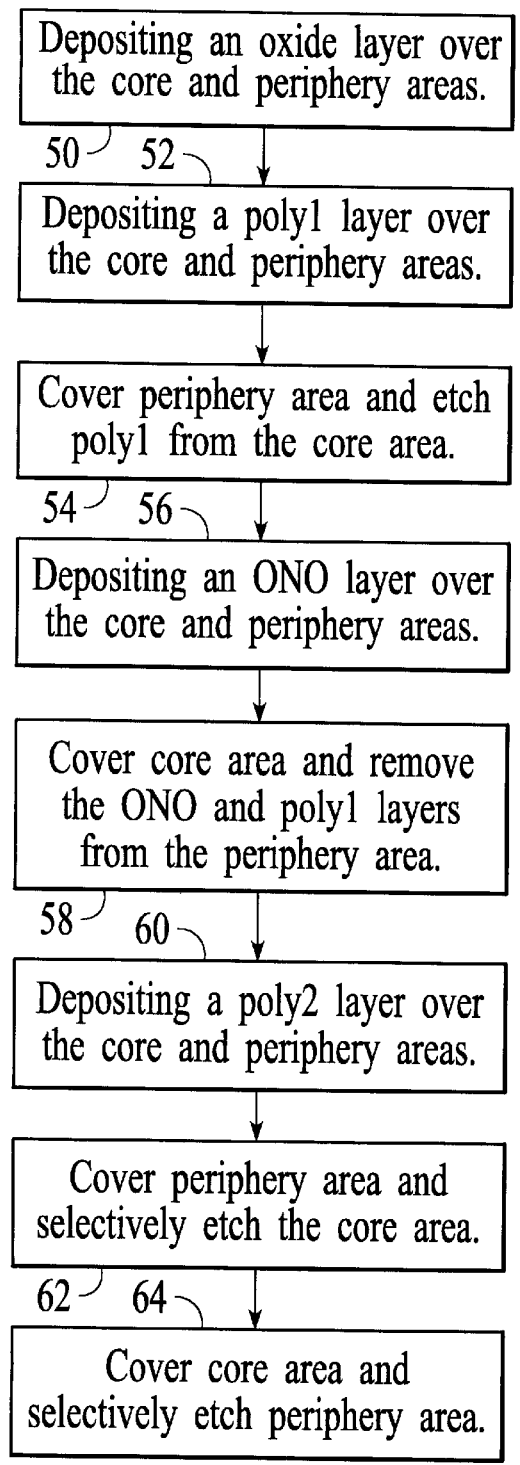
FIGS. 5(A)–5(H) are a flow chart illustrating the method in accordance with the present invention as well as a series of cross sectional views of a substrate showing the resulting structure.
Figure 5:
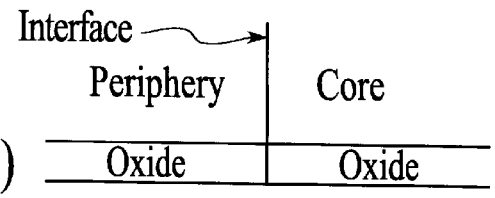
Figure 5:
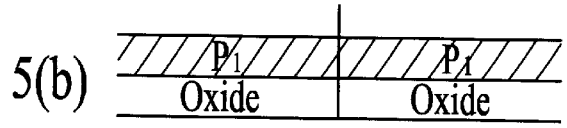
Figure 5:
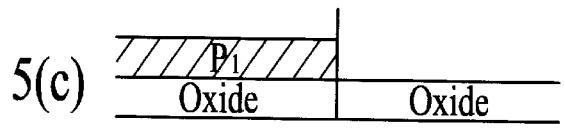
Figure 5:
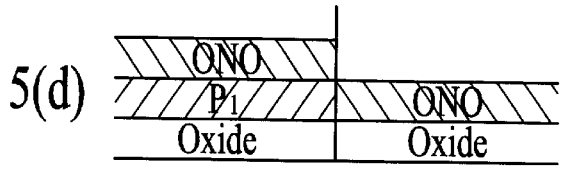
Figure 5:
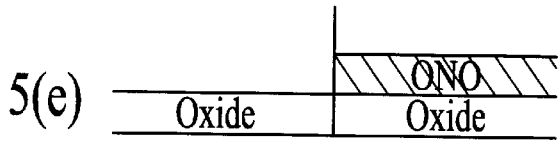
Figure 5:
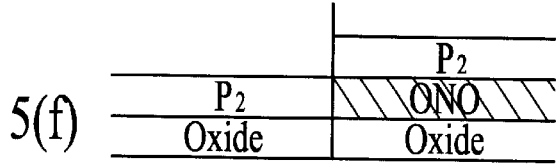
Figure 5:
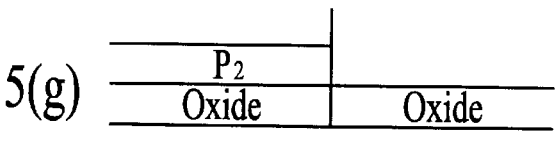
Figure 5:
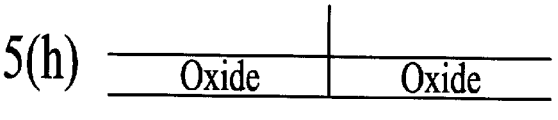

FIG. 5 is a flowchart illustrating the processing steps for fabricating a NAND flash memory in accordance with the present invention. Also shown is a series of cross sectional views (FIGS. 5(a–h)) of a substrate showing the resulting structure.

The process begins by depositing a layer of tunnel oxide of varying thickness over a substrate in both the core area and periphery areas, via step 50. Next, a layer of type-1 polysilicon (poly1) is deposited in both the core area and periphery area, via step 52. Next, the periphery area is covered and the poly1 is etched from the core area, via step 54. After the poly1 is etched from the core area, a layer of oxide nitride (ONO) is deposited over both the core area and periphery area, via step 56.

After the layer of ONO is deposited, the core area is covered by photo resist and the ONO and poly1 layers are removed in the periphery area, via step 58. Next, a type-2 layer of polysilicon (poly2) is deposited over both the core area and the periphery area, via step 60.

Next, instead of etching both the core and periphery areas together, the periphery area is covered with photo resist and the core area is selectively etched, via step 62. Preferably, the core area is etched to the oxide layer thereby removing the poly2 layer, the ONO layer and the poly1 layer. Next, the core area is covered with photo resist and the periphery area is selectively etched, via step 64.

Through the use of the preferred embodiment of the present invention, the occurrence of stringers at the core/periphery interface is substantially reduced. Accordingly, the occurrence of unwanted electrical shorting paths between the adjacent transistors is also substantially reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a memory array comprising a core area and a periphery area, the method comprising the steps of:
    (a) depositing a layer of tunnel oxide over the core area and the periphery area;
    (b) depositing a layer of type-1 polysilicon (poly1) over the core area and the periphery area and on top of the tunnel oxide layer;
    (c) selectively etching the poly1 layer in the core area;
    (d) depositing a layer of oxide nitride (ONO) over the core area and the periphery area;
    (e) selectively etching the ONO and poly1 layers in the periphery area;
    (f) depositing a layer of type-2 polysilicon (poly2) over the core area and the periphery area;
    (g) selectively etching the poly2 and ONO layers in the core area by
        (g1) covering the periphery area with photo resist; and
        (g2) etching the core area to the tunnel oxide layer; and
    (h) after etching the core area, selectively etching the layer of poly2 only in the periphery area wherein the occurrence of stringers is reduced.

2. The method of claim 1 wherein step h) further comprises:
    (i) covering the core area with photo resist; and
    (ii) etching the layer of poly2 in the periphery area.

3. The method of claim 2 wherein the memory array further includes a core/periphery interface at which the occurrence of stringers is reduced.

4. A system for fabricating a memory array comprising a core area and a periphery area, the system comprising:
    means for depositing a layer of tunnel oxide over the core area and the periphery area;
    means for depositing a layer of type-1 polysilicon (poly1) over the core area and the periphery area and on top of the tunnel oxide layer;
    means for selectively etching the poly1 layer in the core area;
    means for depositing a layer of oxide nitride (ONO) over the core area and the periphery area;
    means for selectively etching the ONO and poly1 layers in the periphery area;
    means for depositing a layer of poly2 over the core area and the periphery area;
    means for selectively etching the core area, including means for covering the periphery area with photo resist, and means for etching the core area to the tunnel oxide layer; and
    means for selectively etching the layer of poly2 only in the periphery area wherein the occurrence of stringers is reduced.

5. The system of claim 4 wherein the means for selectively etching the layer of poly2 only in the periphery area further comprises:
    means for covering the core area with photo resist; and
    means for etching the layer of poly2 in the periphery area.

6. The system of claim 5 wherein the memory array further includes a core/periphery interface at which the occurrence of stringers is reduced.

7. A method for fabricating a memory array comprising a core area, a periphery area, and a core/periphery interface, the method comprising the steps of:
    (a) depositing a layer of tunnel oxide over the core area and the periphery area;
    (b) depositing a layer of type-1 polysilicon (poly1) over the core area and the periphery area and on top of the tunnel oxide layer;
    (c) selectively etching the poly1 layer in the core area;
    (d) depositing a layer of oxide nitride (ONO) over the core area and the periphery area;
    (e) selectively etching the ONO and poly1 layers in the periphery area;
    (f) depositing a layer of poly2 over the core area and the periphery area;
    (g) covering the periphery area with photo resist;
    (h) etching the core area to the tunnel oxide layer;
    (i) covering the core area with photo resist; and
    (j) etching the layer of poly2 in the periphery area wherein the occurrence of stringers is reduced at the core/periphery interface.

8. A system for fabricating a memory array comprising a core area, a periphery area, and a core/periphery interface, the system comprising:

means for depositing a layer of tunnel oxide over the core area and the periphery area;

means for depositing a layer of type-1 polysilicon (poly1) over the core area and the periphery area and on top of the tunnel oxide layer;

means for selectively etching the poly1 layer in the core area;

means for depositing a layer of oxide nitride (ONO) over the core area and the periphery area;

means for selectively etching the ONO and poly1 layers in the periphery area;

means for depositing a layer of poly2 over the core area and the periphery area;

means for covering the periphery area with photo resist;

means for etching the core area to the tunnel oxide layer;

means for covering the core area with photo resist; and means for etching the layer of poly2 in the periphery area wherein the occurrence of stringers is reduced at the core/periphery interface.

* * * * *